(12) United States Patent
Kim et al.

(10) Patent No.: US 10,367,137 B2
(45) Date of Patent: Jul. 30, 2019

(54) ELECTRONIC DEVICE INCLUDING A SEMICONDUCTOR MEMORY HAVING A VARIABLE RESISTANCE ELEMENT INCLUDING TWO FREE LAYERS

(71) Applicant: SK hynix Inc., Icheon-Si (KR)

(72) Inventors: Guk-Cheon Kim, Icheon-si (KR); Ki-Seon Park, Icheon-si (KR); Bo-Mi Lee, Icheon-si (KR); Won-Joon Choi, Icheon-si (KR); Yang-Kon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/469,238

(22) Filed: Mar. 24, 2017

(65) Prior Publication Data

US 2017/0200487 A1    Jul. 13, 2017

Related U.S. Application Data

(63) Continuation-in-part of application No. 14/788,420, filed on Jun. 30, 2015.

(30) Foreign Application Priority Data

Dec. 17, 2014  (KR) ........................ 10-2014-0182699

(51) Int. Cl.
    *H01L 43/08*  (2006.01)
    *H01L 43/10*  (2006.01)
    (Continued)

(52) U.S. Cl.
    CPC ............ *H01L 43/08* (2013.01); *G11C 11/161* (2013.01); *H01L 27/222* (2013.01); *H01L 43/10* (2013.01)

(58) Field of Classification Search
    CPC ............ G11C 11/1675; G11C 11/1655; G06F 3/0679; G06F 3/0659; G06F 3/0604;
    (Continued)

(56) References Cited

U.S. PATENT DOCUMENTS

2002/0146895 A1   10/2002   Ramdani et al.
2006/0098354 A1   5/2006    Parkin
(Continued)

FOREIGN PATENT DOCUMENTS

KR   1020030000137   1/2003
KR   1020030054175   7/2003
(Continued)

OTHER PUBLICATIONS

USPTO Final Office Action issued for U.S. Appl. No. 14/158,702, dated Dec. 23, 2015 (10 pages).
(Continued)

*Primary Examiner* — Selim U Ahmed
(74) *Attorney, Agent, or Firm* — Perkins Coie LLP

(57) ABSTRACT

Disclosed are an electronic device comprising a semiconductor memory. The semiconductor memory includes a variable resistance element including a free layer having a variable magnetization direction; a pinned layer having a fixed magnetization direction; and a tunnel barrier layer interposed between the free layer and the pinned layer, wherein the free layer includes: a first free layer adjacent to the tunnel barrier layer and having a perpendicular magnetic anisotropy at an interface with the tunnel barrier layer; and a second free layer spaced apart from the tunnel barrier layer by the first free layer and having a saturation magnetization lower than a saturation magnetization of the first free layer.

15 Claims, 10 Drawing Sheets

(51) Int. Cl.
*G11C 11/16* (2006.01)
*H01L 27/22* (2006.01)

(58) Field of Classification Search
CPC ......... H01L 43/10; H01L 43/02; H01L 43/08; H01L 27/224
See application file for complete search history.

(56) References Cited

U.S. PATENT DOCUMENTS

| | | | |
|---|---|---|---|
| 2006/0261425 A1 | 11/2006 | Suemitsu et al. | |
| 2007/0076471 A1 | 4/2007 | Kano et al. | |
| 2007/0297220 A1 | 12/2007 | Yoshikawa et al. | |
| 2010/0055501 A1 | 3/2010 | Nishimura et al. | |
| 2010/0074092 A1 | 3/2010 | Zhu et al. | |
| 2010/0080048 A1 | 4/2010 | Liu et al. | |
| 2010/0183902 A1* | 7/2010 | Kim .................... | B82Y 25/00 428/811.1 |
| 2011/0064969 A1* | 3/2011 | Chen ................... | B82Y 25/00 428/800 |
| 2011/0089507 A1 | 4/2011 | Mao | |
| 2011/0198756 A1 | 8/2011 | Thenappan et al. | |
| 2011/0248235 A1 | 10/2011 | Jeong et al. | |
| 2011/0297646 A1 | 12/2011 | deVillers et al. | |
| 2012/0069640 A1* | 3/2012 | Nagase ................. | H01L 43/08 365/158 |
| 2012/0092923 A1 | 4/2012 | Bedeschi et al. | |
| 2012/0267733 A1 | 10/2012 | Hu et al. | |
| 2012/0313191 A1* | 12/2012 | Whig .................... | H01L 43/08 257/421 |
| 2012/0326252 A1 | 12/2012 | Yamakawa et al. | |
| 2013/0043530 A1 | 2/2013 | Kim et al. | |
| 2013/0052826 A1 | 2/2013 | Nepomnishy et al. | |
| 2013/0119494 A1 | 5/2013 | Li et al. | |
| 2013/0161768 A1 | 6/2013 | Khvalkovskiy et al. | |
| 2013/0248355 A1 | 9/2013 | Ohsawa et al. | |
| 2014/0099735 A1 | 4/2014 | Horng et al. | |
| 2014/0247648 A1 | 9/2014 | Yoon | |
| 2014/0327095 A1 | 11/2014 | Kim et al. | |
| 2014/0365688 A1* | 12/2014 | Lee ..................... | H01L 43/08 710/7 |
| 2015/0092480 A1 | 4/2015 | Choi et al. | |
| 2015/0162526 A1 | 6/2015 | Lee et al. | |
| 2015/0249206 A1 | 9/2015 | Kim et al. | |
| 2015/0357557 A1 | 12/2015 | Kim et al. | |
| 2016/0180905 A1 | 6/2016 | Kim et al. | |
| 2016/0181514 A1 | 6/2016 | Kim et al. | |
| 2016/0225424 A1 | 8/2016 | Qiu et al. | |

FOREIGN PATENT DOCUMENTS

| | | |
|---|---|---|
| KR | 1020040005472 | 1/2004 |
| KR | 1020060000878 | 1/2006 |
| KR | 100641500 | 10/2006 |
| KR | 1020100005449 | 1/2010 |
| KR | 1020100030054 | 3/2010 |
| KR | 1020100128219 | 12/2010 |
| KR | 101073132 | 6/2011 |
| KR | 101055595 | 8/2011 |
| KR | 1020120047356 | 5/2012 |
| KR | 1020120058113 | 6/2012 |
| KR | 101171387 | 8/2012 |
| KR | 101209328 | 12/2012 |
| KR | 1020130069097 | 6/2013 |
| KR | 1020140011138 | 1/2014 |
| KR | 1020140025165 | 3/2014 |

OTHER PUBLICATIONS

USPTO Non-Final Office Action issued for U.S. Appl. No. 14/158,702, dated Jul. 17, 2015 (16 pages).
USPTO Non-Final Office Action issued for U.S. Appl. No. 14/295,229, dated May 22, 2015 (14 pages).
USPTO Non-Final Office Action issued for U.S. Appl. No. 14/621,646, dated Sep. 15, 2016 (10 pages).
USPTO Non-Final Office Action issued for U.S. Appl. No. 14/295,229, dated Oct. 11, 2016 (23 pages).
USPTO Notice of Allowance and Fees Due for U.S. Appl. No. 14/229,745, dated Oct. 3, 2014 (12 pages).
USPTO Non-Final Office Action issued for U.S. Appl. No. 14/788,420, dated Sep. 12, 2017 (42 pages).
Final Office Action dated Jan. 24, 2019 in U.S. Appl. No. 14/788,420, 22 pages.
USPTO Non-Final Office Action issued for U.S. Appl. No. 14/788,420, dated May 16, 2019 (15 pages).

* cited by examiner

ELECTRONIC DEVICE INCLUDING A SEMICONDUCTOR MEMORY HAVING A VARIABLE RESISTANCE ELEMENT INCLUDING TWO FREE LAYERS

CROSS-REFERENCE TO RELATED APPLICATIONS

This patent document is a continuation-in-part of, and claims priority and benefits of, U.S. patent application Ser. No. 14/788,420 filed on Jun. 30, 2015 and published as US 2016/0181514, entitled "ELECTRONIC DEVICE AND METHOD FOR FABRICATING THE SAME", which further claims priority of Korean Patent Application No. 10-2014-0182699, entitled "ELECTRONIC DEVICE AND METHOD FOR FABRICATING THE SAME" and filed on Dec. 17, 2014. The contents of the before-mentioned patent applications (including US2016/0181514) are incorporated herein by reference in their entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the characteristics of a variable resistance element may be improved.

In an implementation, an electronic device may include a semiconductor memory comprising a variable resistance element exhibiting different resistance states for storing data, and the variable resistance element may include: a free layer having a variable magnetization direction; a pinned layer having a fixed magnetization direction; and a tunnel barrier layer interposed between the free layer and the pinned layer, wherein the free layer includes: a first free layer adjacent to the tunnel barrier layer and having a perpendicular magnetic anisotropy at an interface with the tunnel barrier layer; and a second free layer spaced apart from the tunnel barrier layer by the first free layer and having a saturation magnetization lower than a saturation magnetization of the first free layer.

Implementations of the above device may include one or more the following.

The tunnel barrier layer includes oxygen, the first free layer includes a first ferromagnetic material containing Fe, and the second free layer includes the first ferromagnetic material and a first element which is different from an element included in the first ferromagnetic material, has a higher standard electrode potential than Fe, and reduces a saturation magnetization of the first ferromagnetic material. The first ferromagnetic material includes CoFeB alloy, and the first element includes Cd, Ni, Sn, Sb, Ag or Pd. The first free layer includes a first portion and a second portion, the first portion being closer to the tunnel barrier layer than the second portion, and a content of Fe in the first portion is greater than a content of Fe in the second portion. The first ferromagnetic material includes CoFeB alloy, and a content of Co in the second portion is greater than a content of Co in the first portion. A content of Fe in the first free layer increases towards the tunnel barrier layer. The first ferromagnetic material includes CoFeB alloy, and a content of Co in the first free layer decreases towards the tunnel barrier layer. A thickness of the second free layer is greater than a thickness of the first free layer. The free layer further includes a spacer which is interposed between the first free layer and the second free layer and provides an exchange coupling therebetween. The spacer includes a non-magnetic metal.

In another implementation, an electronic device may include a semiconductor memory comprising a variable resistance element exhibiting different resistance states, and the variable resistance element may include: a free layer having a variable magnetization direction, and including a ferromagnetic material containing Fe and a first metal which is different from Fe and has a higher standard electrode potential than Fe; a pinned layer having a fixed magnetization direction; and a tunnel barrier layer interposed between the free layer and the pinned layer and structured to include oxygen, wherein the free layer includes a first portion which is relatively adjacent to the tunnel barrier layer and a second portion which is relatively far from the tunnel barrier layer, and a content of Fe in the first portion is greater than a content of Fe in the second portion.

Implementations of the above device may include one or more the following.

A content of the first metal in the second portion is greater than a content of the first metal in the first portion. The first metal includes Co. A content of Fe in the free layer increases towards the tunnel barrier layer. A content of the first metal in the free layer decreases towards the tunnel barrier layer.

In another implementation, an electronic device may include a semiconductor memory comprising a variable resistance element exhibiting different resistance states, and the variable resistance element may include: a free layer having a variable magnetization direction; a pinned layer having a fixed magnetization direction; and a tunnel barrier layer interposed between the free layer and the pinned layer and structured to include oxygen, wherein the free layer includes a ferromagnetic material that includes CoFeB alloy and Cd, Ni, Sn, Sb, Ag or Pd that is added to the CoFeB alloy.

In the above device, the CoFeB alloy added with Cd, Ni, Sn, Sb, Ag or Pd has a lower saturation magnetization than the CoFeB alloy without being added with Cd, Ni, Sn, Sb, Ag or Pd.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1:
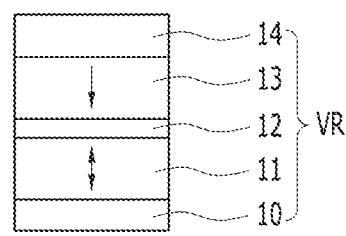
FIG. 1 is a cross-sectional view illustrating a variable resistance element according to a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to describing implementations, a variable resistance element according to a comparative example and a problem thereof will be described.

FIG. 1 is a cross-sectional view illustrating a comparative example of a variable resistance element. Here, a variable resistance element may be an element which exhibits different resistance states of different resistance values and can be switched between different resistance states by applying a voltage or current of a sufficient magnitude. This variable resistance element is structured to store different data according to its resistance states, thereby serving as a memory cell of a semiconductor memory.

Referring to FIG. 1, a variable resistance element VR according to a comparative example may include an MTJ (Magnetic Tunnel Junction) structure which includes a free layer 11, a pinned layer 13, and a tunnel barrier layer 12 interposed between the free layer 11 and the pinned layer 13.

The free layer 11 may have a variable magnetization direction so as to store different data, and be referred to as a storage layer, etc. The pinned layer 13 may have a fixed magnetization direction 13 so that the magnetization direction of the pinned layer 13 is compared to the magnetization direction of the free layer 11, and be referred to as a reference layer, etc. The free layer 11 and the pinned layer 13 may have a single-layered structure or a multi-layered structure including a ferromagnetic material. As an example, each of the free layer 11 and the pinned layer 13 may include an alloy having Fe, Ni or Co as its main component, for example, Fe—Pt alloy, Fe—Pd alloy, Co—Pd alloy, Co—Pt alloy, Fe—Ni—Pt alloy, Co—Fe—Pt alloy, Co—Ni—Pt alloy, Co—Fe—B alloy and the like, or a stack structure of Co/Pt, Co/Pd and the like. The magnetization directions of the free layer 11 and the pinned layer 13 may be substantially parallel to a direction which is perpendicular to an interface between layers constituting the variable resistance element VR, for example, an interface between the free layer 11 and the tunnel barrier layer 12. As indicated by an arrow in the free layer 11, the magnetization direction of the free layer 11 may be varied between a direction from top to bottom and a direction from bottom to top. Also, as indicated by an arrow in the pinned layer 13, the magnetization direction of the pinned layer 13 may be fixed in a direction from top to bottom. However, in another example, the magnetization direction of the pinned layer 13 may be fixed in a direction from bottom to top. The magnetization direction of the free layer 11 may be changed by spin transfer torque. Relative positions of the free layer 11 and the pinned layer 13 can be changed with each other with regard to the tunnel barrier layer 12 therebetween. For example, unlike this implementation, the pinned layer 13 may be located under the tunnel barrier layer 12 and the free layer 11 may be located over the tunnel barrier layer 12.

The tunnel barrier layer 12 may allow tunneling of electrons between the free layer 11 and the pinned layer 13 if necessary, for example, during a data writing operation to change the resistance state of the variable resistance element VR. The tunnel barrier layer 12 may include an insulating oxide, for example, MgO, CaO, SrO, TiO, VO, NbO, or others.

In the above variable resistance element VR, the magnetization direction of the free layer 11 may be varied according to a voltage or current applied to the variable resistance element VR, thereby storing data. When the magnetization directions of the free layer 11 and the pinned layer 13 are parallel to each other, the variable resistance element VR may be in a low resistance state, and store data '1'. On the other hand, when the magnetization directions of the free layer 11 and the pinned layer 13 are anti-parallel to each other, the variable resistance element VR may be in a high resistance state, and store data '0'. In some implementations, the variable resistance element VR can be structured to store data '0' or '1' when the magnetizations of the layers 11 and 13 are in the two different relative orientations relative to each other. For example, the variable resistance element VR may be used to store data '0' when the magnetization directions of the free layer 11 and the pinned layer 13 are parallel to each other and store data '1' when the magnetization directions of the free layer 11 and the pinned layer 13 are anti-parallel to each other.

Furthermore, the variable resistance element VR may further include layers having various uses for improving the characteristics of the MTJ structure or fabricating processes. For example, the variable resistance element VR may further include a seed layer 10 which is located under the MTJ structure and grows the free layer 11 to have a desired crystalline structure, a capping layer 14 which is located over the MTJ structure and used in patterning the variable resistance element VR, and the like. The seed layer 10 and the capping layer 14 may have a single-layered structure or a multi-layered structure including a conductive material, and serve as electrodes which are located at a lower end and an upper end of the variable resistance element VR to couple the variable resistance element VR with other elements. The seed layer 10 and/or the capping layer 14 may include a metal such as Ta, Ru, PtMn, Al, Hf, Cr, W or Ti, a metal nitride such as TaN, AlN, HfN, CrN, WN or TiN, or a combination thereof.

In the above variable resistance element VR including the MTJ structure, some characteristics, for example, a high TMR (tunneling magnetoresistance) and a low magnetization reversal current may be required. The high TMR may mean that a resistance difference between the low resistance state and the high resistance state of the variable resistance element VR is relatively large. In this case, the variable resistance element VR may be suitable for serving as a memory cell. The low magnetization reversal current may mean that a current required for changing the magnetization direction of the free layer 11 is relatively low. In this case, operating characteristics of the variable resistance element VR can be improved. In order to satisfy these characteristics, for example, to increase the TMR and reduce the magnetization reversal current, it is required that a thickness of the free layer 11 increases.

The free layer 11 and/or the pinned layer 13 of the above variable resistance element VR may use a material that has a horizontal magnetic property. In some implementation, the material of the free layer 11 and/or the pinned layer 13 inherently satisfies the horizontal magnetic property. For example, the free layer 11 and/or the pinned layer 13 may include CoFeB alloy. This is because this material may satisfy the high TMR. Although the material having the horizontal magnetic property is used as the free layer 11 and/or the pinned layer 13, a perpendicular magnetic property of the free layer 11 and/or the pinned layer 13 may be satisfied by using an interface magnetic anisotropy generated at an interface between the free layer 11 and the tunnel barrier layer 12 and/or between the pinned layer 13 and the tunnel barrier layer 12. While the thickness of the free layer 11 is required to increase to have increased TMR and reduced magnetization reversal current, there may be a limit to increase the thicknesses of the free layer 11 and/or the pinned layer 13 in order to satisfy the perpendicular magnetic property of the variable resistance element VR. This is because the inherent horizontal magnetic property of the free layer 11 and/or the pinned layer 13 is superior to the perpendicular magnetic property appearing at the interface between the free layer 11 and the tunnel barrier layer 12 and/or between the pinned layer 13 and the tunnel barrier layer 12 when the thickness of the free layer 11 and/or the pinned layer 13 exceeds a certain limit.

In summary, a conflicting problem may occur in increasing the thickness of the free layer 11. That is, the thickness of the free layer 11 needs to be increased in order to increase the TMR and reduce the magnetization reversal current of the variable resistance element VR but needs to be limited not to exceed a certain limit in order to satisfy the perpendicular magnetic property of the variable resistance element VR.

In the present implementation, a variable resistance element including a free layer which has a new material and/or a new structure for solving the above problem may be provided.

Figure 2A:
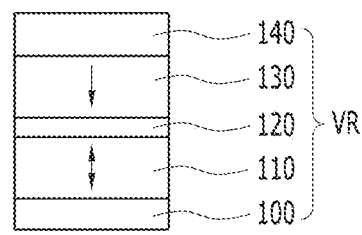
FIGS. 2A to 2D are cross-sectional views illustrating a variable resistance element according to various implementations of the disclosed technology.
Figure 2B:
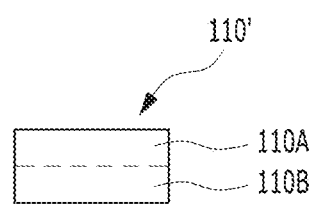
Figure 2C:
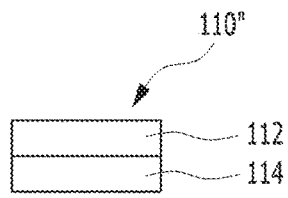
Figure 2D:
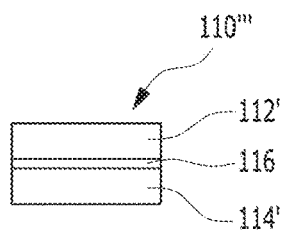

FIG. 2A is a cross-sectional view illustrating a variable resistance element according to an implementation of the disclosed technology, FIG. 2B is a view illustrating another example of a free layer of FIG. 2A, FIG. 2C is a view illustrating still another example of a free layer of FIG. 2A, and FIG. 2D is a view illustrating still another example of a free layer of FIG. 2A. The description will be made based on FIG. 2A, and FIGS. 2B to 2D will be further referred as necessary.

Referring to FIG. 2A, a variable resistance element VR according to an implementation may include an MTJ (Magnetic Tunnel Junction) structure which includes a free layer 110 having a variable magnetization direction, a pinned layer 130 having a fixed magnetization direction, and a tunnel barrier layer 120 interposed between the free layer 110 and the pinned layer 130 and allowing tunneling of electrons between the free layer 110 and the pinned layer 130 if necessary, for example, during a data writing operation to change a resistance state of the variable resistance element VR.

The magnetization directions of the free layer 110 and the pinned layer 130 may be substantially parallel to a direction which is perpendicular to an interface between layers constituting the variable resistance element VR, for example, an interface between the free layer 110 and the tunnel barrier layer 120. As indicated by an arrow in the free layer 110, the magnetization direction of the free layer 110 may be varied between a direction from top to bottom and a direction from bottom to top. Also, as indicated by an arrow in the pinned layer 130, the magnetization direction of the pinned layer 130 may be fixed in a direction from top to bottom. However, in another example, the magnetization direction of the pinned layer 130 may be fixed in a direction from bottom to top. The magnetization direction of the free layer 110 may be changed by spin transfer torque. Relative positions of the free layer 110 and the pinned layer 130 may be changed with each other with regard to the tunnel barrier layer 120 therebetween. For example, unlike this implementation, the pinned layer 130 may be located under the tunnel barrier layer 120 and the free layer 110 may be located over the tunnel barrier layer 120.

The pinned layer 130 may have a single-layered structure or a multi-layered structure including a ferromagnetic material. The pinned layer 130 may include only a ferromagnetic material, or two ferromagnetic materials and a non-magnetic spacer interposed between the two ferromagnetic materials and providing an exchange coupling. As an example, the ferromagnetic material included in the pinned layer 130 may include an alloy having Fe, Ni or Co as its main component, for example, Fe—Pt alloy, Fe—Pd alloy, Co—Pd alloy, Co—Pt alloy, Fe—Ni—Pt alloy, Co—Fe—Pt alloy, or Co—Ni—Pt alloy and the like. This alloy may be doped with impurities such as boron (B). Alternatively, as another example, the ferromagnetic material included in the pinned layer 130 may include a stack structure of or including Co/Pt, Co/Pd, Fe/Pd, or Fe/Pt and the like. The spacer may include a non-magnetic metal such as Ru, Cr, Cu, Ti, W, or others.

The tunnel barrier layer 120 may include an insulating oxide, for example, MgO, CaO, SrO, TiO, VO, NbO, or others.

The free layer 110 may have a single-layered structure or a multi-layered structure including a ferromagnetic material.

It may be required that the free layer 110 of this implementation uses a material and/or a structure which can enhance or at least maintain an interface magnetic anisotropy generated at an interface between the free layer 110 and the tunnel barrier layer 120 and has a lower Ms (saturation magnetization), compared to the free layer 11 of the comparative example. This is because it is easier to maintain a perpendicular magnetic property of a low Ms material as compared to a high Ms material even when a thickness of the low Ms material increases.

As an example, when the free layer 11 of the comparative example has a single-layered structure including a first ferromagnetic material containing iron (Fe), the free layer 110 of this implementation may further contain a first element which can reduce an Ms of the first ferromagnetic material, in addition to the first ferromagnetic material. In some implementations, the free layer 110 may include an alloy of the first ferromagnetic material and the first element. The first element may be different from an element included in the first ferromagnetic material. Furthermore, in order to at least maintain the interface magnetic anisotropy generated at an interface between the free layer 110 and the tunnel barrier layer 120, the first element may be an element which has a weaker bonding force with oxygen (O) than Fe. Hence, the first element may have a higher standard electrode potential than Fe. This is because the perpendicular magnetic property of the free layer 110 at the interface with the tunnel barrier layer 120 may be implemented by hybridization of 3$d$ orbital of Fe included in the free layer 110 and 2$p$ orbital of oxygen included in the tunnel barrier layer 120. If the first element is more susceptible to oxidation than Fe, adding of the first element to the first ferromagnetic material makes the interface magnetic anisotropy lower, and thus, such addition is not appropriate.

For example, when the free layer 11 of the comparative example has a single-layered structure including CoFeB alloy, the free layer 110 of this implementation may further include a first element which can lower an Ms of CoFeB alloy and does not break a bond between Fe included in CoFeB alloy and O included in the tunnel barrier layer 120, in addition to CoFeB alloy. Here, the first element may be different from Co, Fe and B. For example, the first element may include Cd, Ni, Sn, Sb, Ag or Pd.

In this case, the interface magnetic anisotropy generated between the free layer 110 and the tunnel barrier layer 120 may be maintained at a level same as or similar to that of the comparative example, and the Ms of the free layer 110 may be lowered compared to the comparative example. As a result, the thickness of the free layer 110 can be increased while satisfying the perpendicular magnetic property of the free layer 110, and thus required characteristics of the variable resistance element VR such as the high TMR, the low magnetization reversal current and the like can be improved.

Meanwhile, except for the above-described implementation, a material and/or a structure of a free layer may be variously modified in order to enhance or at least maintain an interface magnetic anisotropy between the free layer and a tunnel barrier layer and reduce an Ms of the free layer. This will be described with reference to FIGS. 2B to 2D.

First, referring to FIG. 2B, a free layer 110' of this implementation may have substantially the same element composition as the free layer 11 of the comparative example. For example, when the free layer 11 of the comparative example has a single-layered structure including a first ferromagnetic material containing Fe, the free layer 110' may also include the first ferromagnetic material. For example, the free layer 110' may have a single-layered structure including CoFeB alloy.

However, unlike the comparative example, a concentration of Fe in the free layer 110' may not be constant. In FIG. 2B, a portion of the free layer 110' which is relatively adjacent to the tunnel barrier layer 120 is referred to as a first portion 110A and another portion of the free layer 110', except for the first portion 110A, is referred to as a second portion 110B. The first portion 110A is closer to the tunnel barrier layer 120 than the second portion 110B is. A content of Fe in the first portion 110A may be greater than a content of Fe in the second portion 110B. Furthermore, a content of a second element of the first ferromagnetic material, except for Fe, in the second portion 110B may be greater than a content of the second element in the first portion 110A. This is for enhancing and/or at least maintaining an interface magnetic anisotropy in the first portion 110A of the free layer 110', which is relatively adjacent to the tunnel barrier layer 120, while reducing an Ms of the second portion 110B of the free layer 110', which is relatively far from the tunnel barrier layer 120 and substantially irrelevant to the interface magnetic anisotropy. The second element may be cobalt (Co). Since Co is a metal having a higher standard electrode potential than Fe, it may not interfere with the orbital bond between Fe and O. Also, when a content of Co increases, an Ms of a ferromagnetic material containing Co may be reduced. In this case, a thickness of the second portion 110B may be increased without deteriorating the perpendicular magnetic property of the free layer 110'. Therefore, a total thickness of the free layer 110' can be increased, and thus required characteristics of the variable resistance element VR may be secured.

Here, the content of Fe and/or the content of Co in each of the first portion 110A and the second portion 110B may be constant. Alternatively, the content of Fe and/or the content of Co in each of the first portion 110A and the second portion 110B may be varied. For example, as a distance from the interface between the tunnel barrier layer 120 and the free layer 110' increases, the content of Fe in the free layer 110' may gradually decrease or the content of Co in the free layer 110' may gradually increase.

Next, referring to FIG. 2C, a free layer 110" of this implementation may have a double-layered structure including a first free layer 112 which is relatively adjacent to the tunnel barrier layer 120 and a second free layer 114 which is relatively far from the tunnel barrier layer 120.

The first free layer 112 may be structured to secure an interface magnetic anisotropy with the tunnel barrier layer 120. For example, the first free layer 112 may be substantially the same as the free layer 11 of the comparative example. For example, when the free layer 11 of the comparative example has a single-layered structure including a first ferromagnetic material containing Fe, the first free layer 112 may also include the first ferromagnetic material. For example, the first free layer 112 may have a single-layered structure including CoFeB alloy. However, a thickness of the first free layer 112 may be limited in order to secure its perpendicular magnetic property. Therefore, the second free layer 114 which will be described later may be further formed to increase a total thickness of the free layer 110". Alternatively, as another example, the first free layer 112 may have the same element composition as the free layer 11 of the comparative example, but a concentration of Fe in the first free layer 112 may be varied depending on a distance from the tunnel barrier layer 120. That is, the first free layer 112 may be substantially the same as the free layer 110' of FIG. 2B.

The second free layer 114 may be structured to lower an Ms of the free layer 110", regardless of the interface magnetic anisotropy. For example, when the first free layer 112 includes CoFeB alloy, the second free layer 114 may further contain a first element which can reduce an Ms of CoFeB alloy, for example, Cd, Ni, Sn, Sb, Ag or Pd, in addition to the CoFeB alloy. Since the second free layer 114 is irrelevant to the interface magnetic anisotropy and has a low Ms, a thickness of the second free layer 114 may be increased. For example, the second free layer 114 may be thicker than the first free layer 112. As a result, the total thickness of the free layer 110" may be increased.

Next, referring to FIG. 2D, the free layer 110''' may have a triple-layered structure including a first free layer 112' which is relatively adjacent to the tunnel barrier layer 120, a second free layer 114' which is relatively far from the tunnel barrier layer 120, and a spacer interposed between the first free layer 112' and the second free layer 114'.

The first free layer 112' and the second free layer 114' correspond to the first free layer 112 and the second free layer 114 of FIG. 2C, respectively. In some implementations, the first free layer 112' and the second free layer 114' may be substantially the same as the first free layer 112 and the second free layer 114 of FIG. 2C, respectively. Accordingly, the first free layer 112' may be a layer to secure an interface magnetic anisotropy with the tunnel barrier layer 120, and the second free layer 114' may be a layer having a lower Ms compared to the first free layer 112'. The spacer 116 may provide an exchange coupling between the first free layer 112' and the second free layer 114'. The spacer 116 may include a non-magnetic metal such as Ru, Cr, Cu, Ti or W.

By the above-described free layers 110, 110', 110" and 110''', an interface magnetic anisotropy between each of the free layers 110, 110', 110" and 110''' and the tunnel barrier layer 120 may be secured, and thus a perpendicular magnetic property of each of the free layers 110, 110', 110" and 110''' may be satisfied. Also, a thickness of each of the free layers 110, 110', 110" and 110''' may be increased, and thus required characteristics of the variable resistance element VR are satisfied. Hence, the implementations of the disclosed technology improve the characteristics of the variable resistance element VR.

Referring again to FIG. 2A, the variable resistance element VR may store data by changing the magnetization direction of the free layer 110 by applying a voltage or current applied to the variable resistance element VR. When the magnetization directions of the free layer 110 and the pinned layer 130 are parallel to each other, the variable resistance element VR may be in a low resistance state, and store data '1'. On the other hand, when the magnetization directions of the free layer 110 and the pinned layer 130 are anti-parallel to each other, the variable resistance element VR may be in a high resistance state, and store data '0'. As discussed, it is also possible to configure the variable resistance element to store data '0' when the magnetization directions of the free layer 110 and the pinned layer 130 are parallel to each other and store data '1' when the magnetization directions of the free layer 110 and the pinned layer 130 are anti-parallel to each other.

Furthermore, the variable resistance element VR may further include layers having various uses for improving the characteristics of the MTJ structure or fabricating processes. For example, the variable resistance element VR may further include a seed layer 100 which is located under the MTJ structure and grows the free layer 110 to have a desired crystalline structure, a capping layer 140 which is located over the MTJ structure and used in patterning the variable resistance element VR, and the like. The seed layer 100 and the capping layer 140 may have a single-layered structure or a multi-layered structure including a conductive material, and serve as electrodes which are located at a lower end and an upper end of the variable resistance element VR to couple the variable resistance element VR with other elements.

Figure 3:
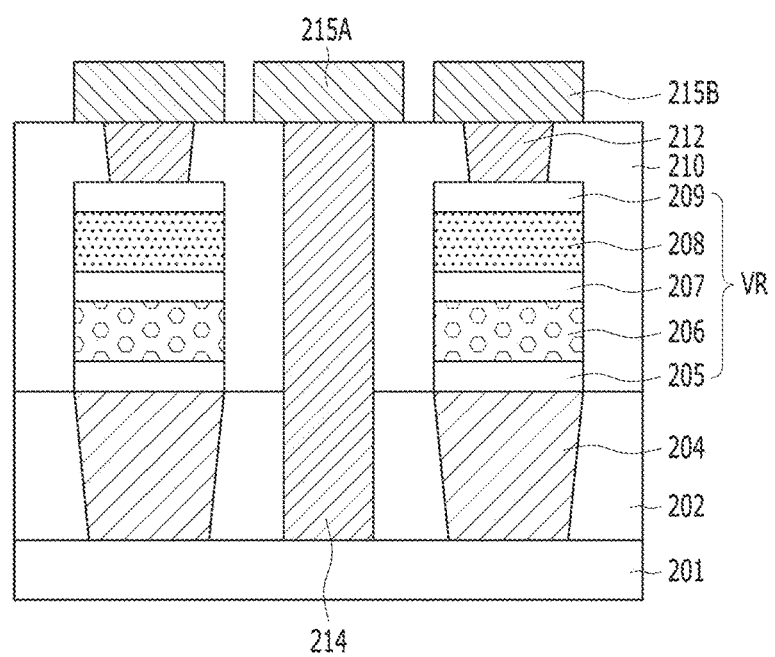
FIG. 3 is a cross-sectional view illustrating a semiconductor device according to one implementation of the disclosed technology.

FIG. 3 is a cross-sectional view illustrating a semiconductor device according to one implementation of the disclosed technology.

As shown in FIG. 3, a semiconductor device according to this implementation may include a substrate 201 having a certain required structure formed on the substrate, e.g., a switching element, etc., a first interlayer insulating layer 102 formed on the substrate 201, and a bottom electrode contact 204 formed through the first interlayer insulating layer 202 to electrically connect one end of the switching element to a variable resistance element VR. The variable resistance element VR may be formed on the first interlayer insulating layer 202.

The variable resistance element VR may be formed over the first interlayer insulating layer 202. Also, the semiconductor device may further include a second interlayer insulating layer 210 that fills or is arranged between the variable resistance elements VR, and first and second conductive lines 215A and 215B formed over the second interlayer insulating layer 210.

In addition, the semiconductor device may further include a top electrode contact 212 formed through the second interlayer insulating layer 210 over the variable resistance element VR to electrically connect the variable resistance element VR to the second conductive line 215B.

Furthermore, the semiconductor device may include a source line contact 214 formed through the first and second interlayer insulating layers 202 and 210 between the variable resistance elements VR to electrically connect the first conductive line 215A to the substrate 201.

The switching element is configured to select a specific unit cell among a plurality of unit cells included in a semiconductor device. The switching element may be disposed in each unit cell, and may include a transistor, or a diode, etc. One end of the switching element may be electrically connected to a first contact plug 204, and the other end of the switching element may be electrically connected to a source line (not shown).

The first interlayer insulating layer 202 and the second interlayer insulating layer 210 may be formed of or include any one single layer selected from an oxide layer, a nitride layer or an oxynitride layer, or a stack of two or more of these layers.

The variable resistance element VR may include substantially the same structure as the variable resistance element VR shown in FIG. 2A.

That is, the variable resistance element VR may include a magnetic tunnel junction (MTJ) structure including a free layer 206 having a variable magnetization direction, a pinned layer 208 having a fixed magnetization direction, and a tunnel barrier layer 207 interposed between the free layer 206 and the pinned layer 208. Furthermore, the variable resistance element VR may further include a seed layer 205 disposed under the MTJ structure, a capping layer 209 disposed over the MTJ structure, and the like.

Herein, the free layer 206 may be substantially the same as one of the free layers 110, 110', 110" and 110''' shown in FIGS. 2A to 2D.

First and second conductive lines 215A and 215B may include a metallic layer. The metallic layer means a conductive layer including a metal element, and may include a metal layer, a metal oxide layer, a metal nitride layer, a metal oxynitride layer, or a metal silicide layer, etc. In addition, the first and second conductive lines 215A and 215B may be formed simultaneously using the same mask. In addition, the first and second conductive lines 215A and 215B may perform different functions depending on portions to which they are connected. In other words, the first conductive line 215A that is connected to the substrate 201 may function as a source line, and the second conductive line 215B that is electrically connected to the variable resistance element VR may function as a bit line.

The bottom electrode contact 204, the top electrode contact 212 and the source line contact 214 may include a semiconductor layer or a metallic layer. The bottom electrode contact 204 may function to electrically connect the variable resistance element VR to a switching element (not shown). The top electrode contact 212 may function to electrically connect the variable resistance element VR to a second conductive line 215B. The source line contact (SLC) 214 may function to electrically connect the substrate 201 to the first conductive line 215A. The source line contacts 214 and the variable resistance elements VR may be alternately and repeatedly arranged such that the source line contacts 214 and the variable resistance elements VR do not lie on the same line.

FIG. 4A to 4I are cross-sectional views illustrating a method for fabricating a semiconductor device in accordance with one implementation of the disclosed technology. FIG. 4A to 4I illustrate a fabrication method for forming the semiconductor device illustrated in FIG. 3. To facilitate understanding of the implementation, the same reference numerals as those in FIG. 3 are used in FIG. 4A to 4I.

Figure 4A:
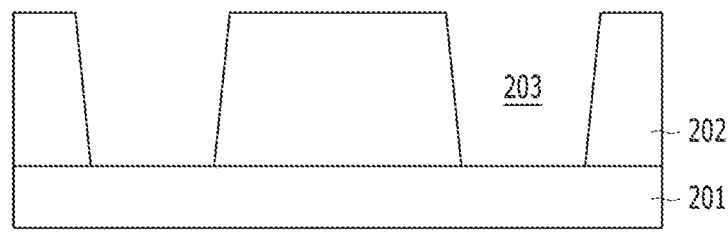
FIGS. 4A to 4I are cross-sectional views illustrating a method for fabricating a semiconductor device according to one implementation of the disclosed technology.

As shown in FIG. 4A, a substrate 201 having a certain structure formed on the substrate, for example, a switching element (not shown), provided. Herein, the switching element is configured to select a specific unit cell among unit cells included in a semiconductor device, and may include a transistor, or a diode, etc. One end of the switching element may be electrically connected to a bottom electrode contact as described below, and the other end thereof may be electrically connected to a source line through a source line contact as described below.

Next, a first interlayer insulating layer 202 is formed over the substrate 201. The first interlayer insulating layer 202 may be composed of or include any one single layer including an oxide layer, a nitride layer or an oxynitride layer, or a stack of two or more of these layers.

Subsequently, a first contact hole 203 is formed through the first interlayer insulating layer 202 so as to expose the substrate 201

Figure 4B:
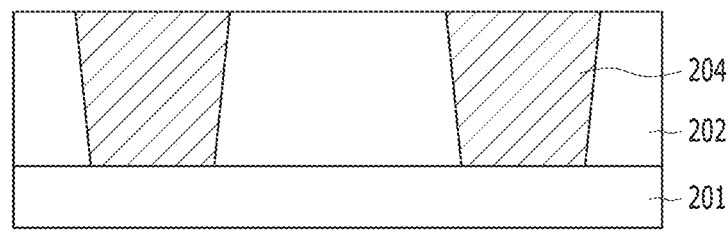

As shown in FIG. 4B, a conductive material is gap-filled in the first contact hole 203 to form a bottom electrode contact 204. The bottom electrode contact 204 may be formed through a series of process steps including forming a conductive material over the surface so as to gap-fill the first contact hole 203 (see FIG. 4A), and performing an isolation process to electrically isolate adjacent bottom electrode contacts 204 from each other. The isolation process may be performed by etching or polishing the conductive material, formed all over the surface, using a blanket etching (e.g., etchback) process or a chemical mechanical polishing (CMP) process until the first interlayer insulating layer 202 is exposed.

Figure 4C:
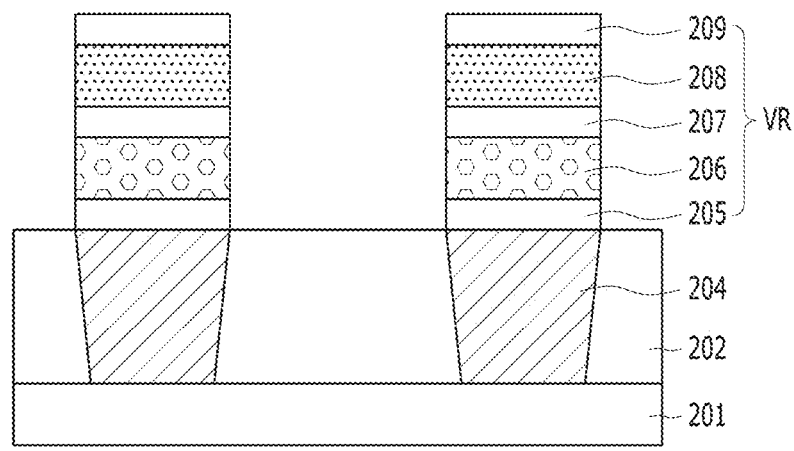

As shown in FIG. 4C, a variable resistance element VR is formed over the first interlayer insulating layer 202 including the bottom electrode contact 204. The variable resistance element VR may include a stack including a seed layer 205, a free layer 206, a tunnel barrier layer 207, a pinned layer 208 and a capping layer 209, and may further include a protective layer (not shown) formed on the sidewall of the stack structure. In addition, the variable resistance element VR may further include a barrier layer for enhancing the characteristics of each magnetic layer.

The variable resistance element VR may include the same structure and material as those described with reference to FIG. 3.

Figure 4D:
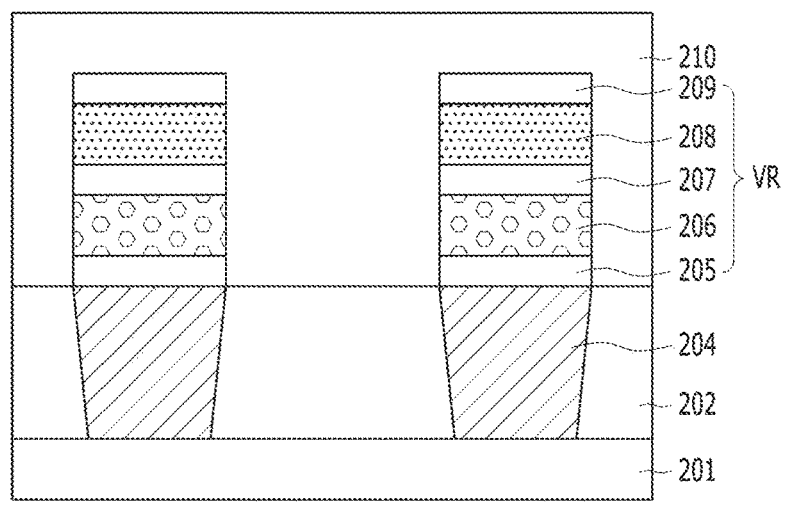

As shown in FIG. 4D, a second interlayer insulating layer 210 may be formed on the first interlayer insulating layer 202. The second interlayer insulating layer 210 may be formed to a thickness sufficient for filling between the variable resistance elements VR. For example, the second interlayer insulating layer 210 may be formed to have a surface level higher than the top surface of the variable resistance element VR. The second interlayer insulating layer 210 may be formed to include the same material as that of the first interlayer insulating layer 202. The second interlayer insulating layer 210 may be formed of or include, for example, any one single layer including an oxide layer, a nitride layer or an oxynitride layer, or a stack of two or more of these layers.

Figure 4E:
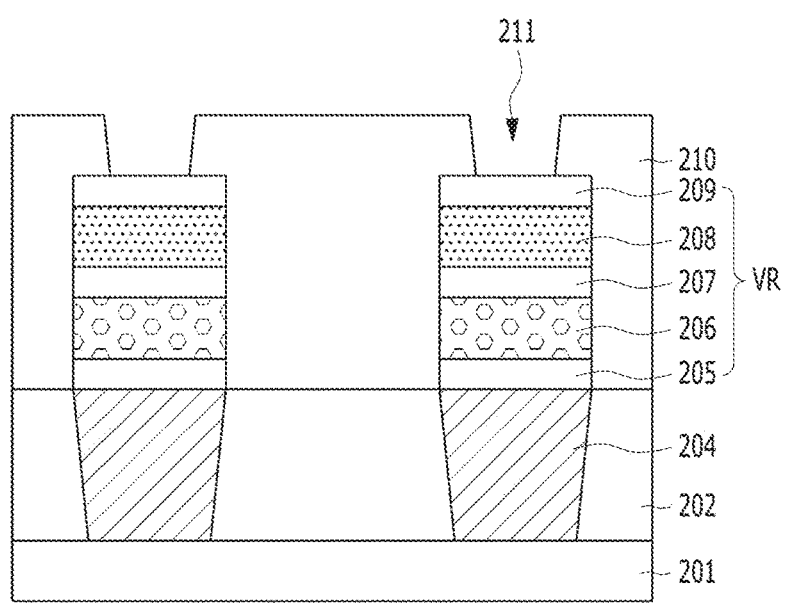

As shown in FIG. 4E, the second interlayer insulating layer 210 may be selectively etched to form a second contact hole 211 that exposes the top surface of the variable resistance element VR.

Figure 4F:
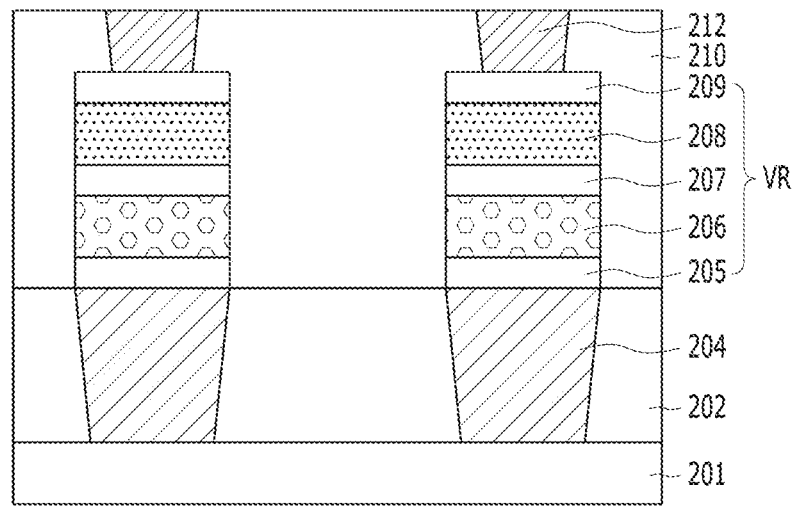

As shown in FIG. 4F, a conductive material is filled in the second contact hole 211 to form a top electrode contact 212. The top electrode contact 212 may function to electrically connect the variable resistance element VR with a conductive line to be formed in a subsequent process, and may function as an electrode of the variable resistance element VR.

The top electrode contact 212 may be formed by a series of process steps including forming a conductive material over the surface so as to gap-fill the second contact hole 211 (see FIG. 4E), and performing an isolation process to electrically isolate adjacent top electrode contacts 204 from each other. The isolation process may be performed by etching or polishing the conductive material, formed over the surface, using a blanket etching (e.g., etchback) process or a chemical mechanical polishing (CMP) process until the second interlayer insulating layer 210 is exposed.

Figure 4G:
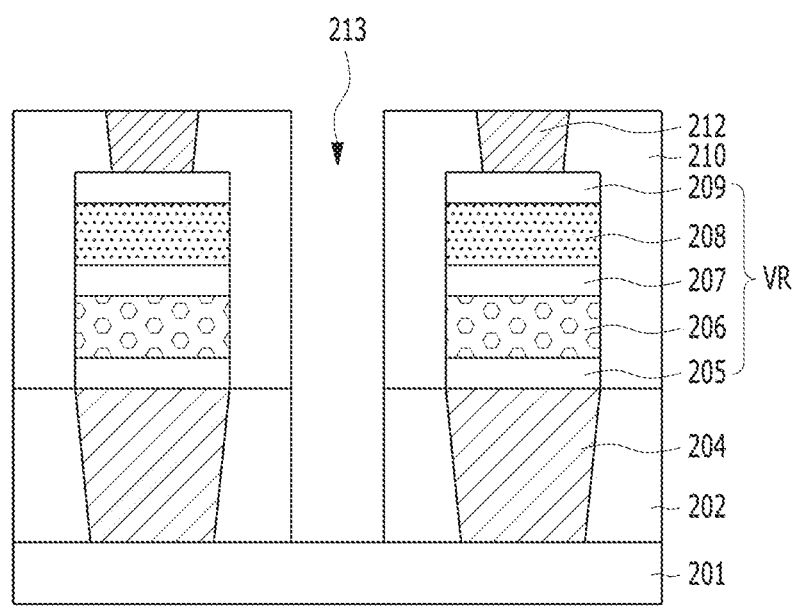

As shown in FIG. 4G, the first and second interlayer insulating layers 202 and 210 between the variable resistance elements VR may be selectively etched to form a third contact hole 213 that exposes the substrate 201.

The third contact holes 213 and the variable resistance elements VR may be arranged alternately such that they do not lie on the same line.

Figure 4H:
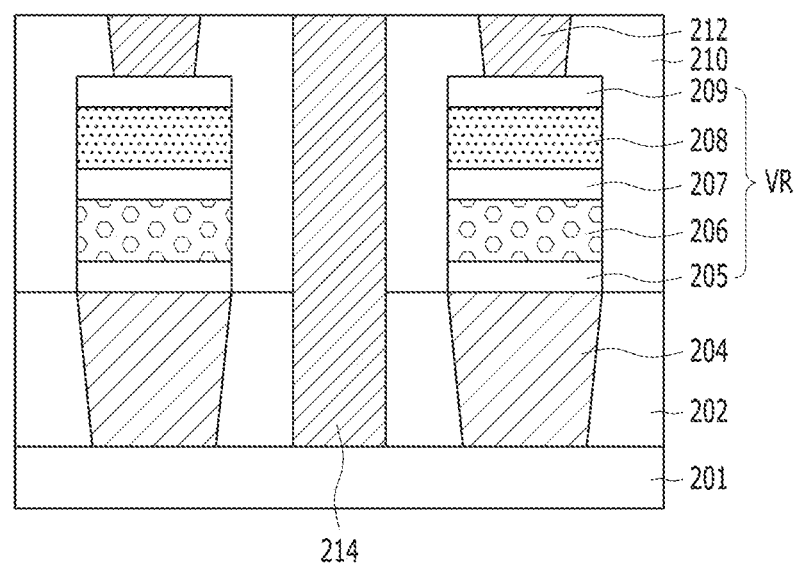

As shown in FIG. 4H, a conductive material is filled in the third contact hole 213 (see FIG. 4G) to form a source line contact 214. The source line contact 214 may be or include a contact plug that electrically connects the substrate 201 to a conductive line (i.e., a source line) that is to be formed by a subsequent process.

Figure 4I:
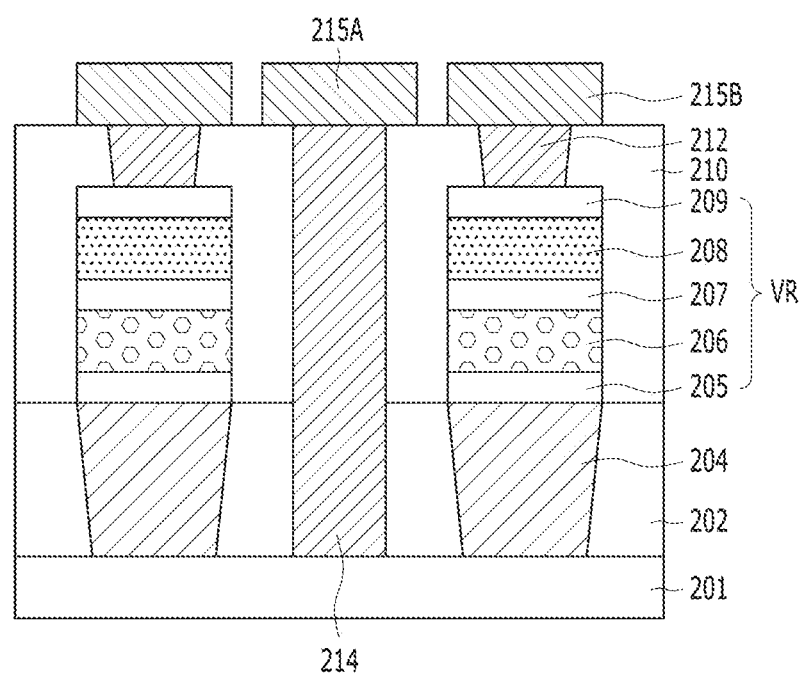

As shown in FIG. 4I, first and second conductive lines 215A and 215B may be formed on the second interlayer layer 210 including the top electrode contact 212 and the source line contact 214.

The first and second conductive lines 215A and 215B may include a metallic layer. The metallic layer means a conductive layer including a metal element, and may include a metal layer, a metal oxide layer, a metal nitride layer, a metal oxynitride layer, or a metal silicide layer, etc. In addition, the first and second conductive lines 215A and 215B may be formed simultaneously using the same mask. Also, the first and second conductive lines 215A and 215B may perform different functions depending on portions to which they are connected. For example, the first conductive line 215A that is connected to the substrate 201 may function as a source line, and the second conductive line 215B that is electrically connected to the variable resistance element VR may function as a bit line.

As described above, according to the electronic device including the semiconductor memory and the fabrication method thereof according to the above-described implementations, the characteristics of the variable resistance element can be improved.

The above and other memory circuits or semiconductor devices based on the disclosed technology can be used in a range of devices or systems. FIGS. 5-9 provide some examples of devices or systems that can implement the memory circuits disclosed herein.

Figure 5:
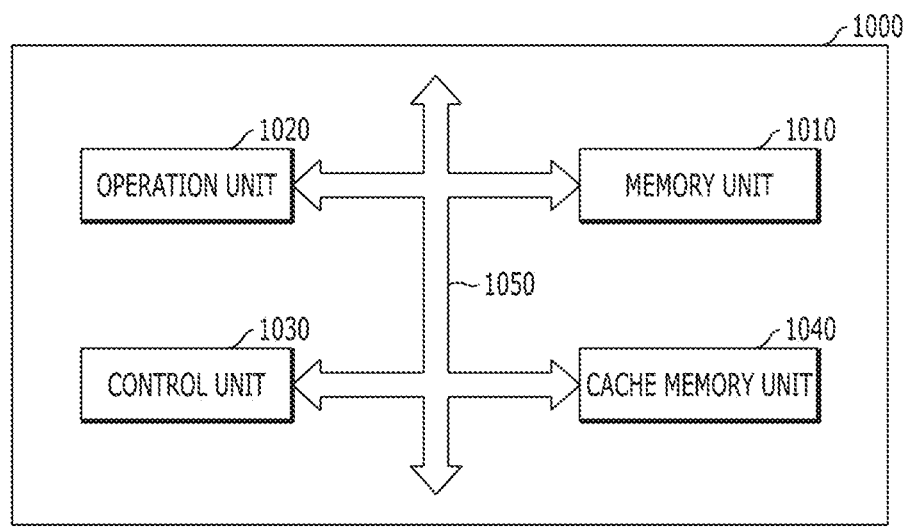
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element including a free layer having a variable magnetization direction; a pinned layer having a fixed magnetization direction; and a tunnel barrier layer interposed between the free layer and the pinned layer, wherein the free layer includes: a first free layer adjacent to the tunnel barrier layer and having a perpendicular magnetic anisotropy at an interface with the tunnel barrier layer; and a second free layer spaced apart from the tunnel barrier layer by the first free layer and having a saturation magnetization lower than a saturation magnetization of the first free layer. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
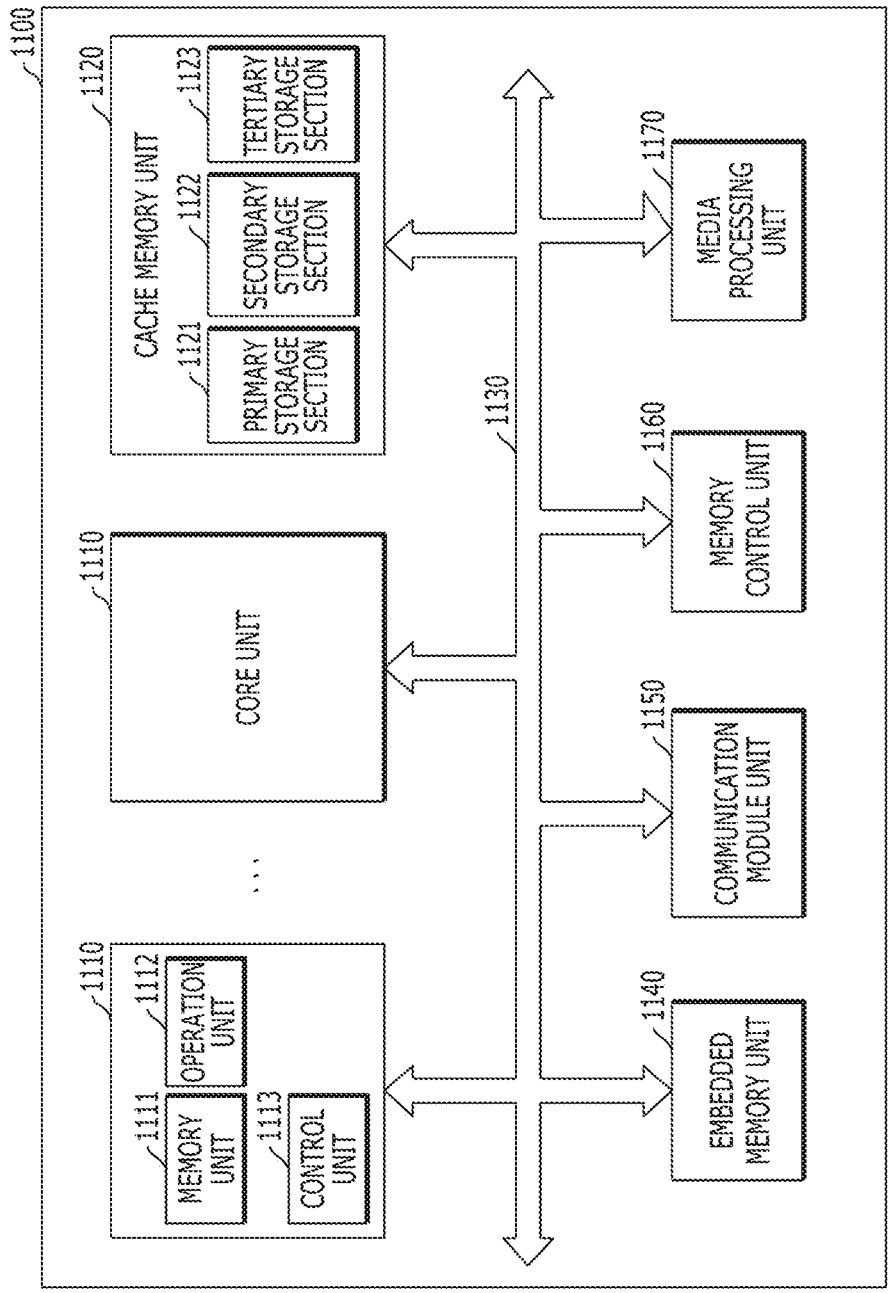
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a free layer having a variable magnetization direction; a pinned layer having a fixed magnetization direction; and a tunnel barrier layer interposed between the free layer and the pinned layer, wherein the free layer includes: a first free layer adjacent to the tunnel barrier layer and having a perpendicular magnetic anisotropy at an interface with the tunnel barrier layer; and a second free layer spaced apart from the tunnel barrier layer by the first free layer and having a saturation magnetization lower than a saturation magnetization of the first free layer. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
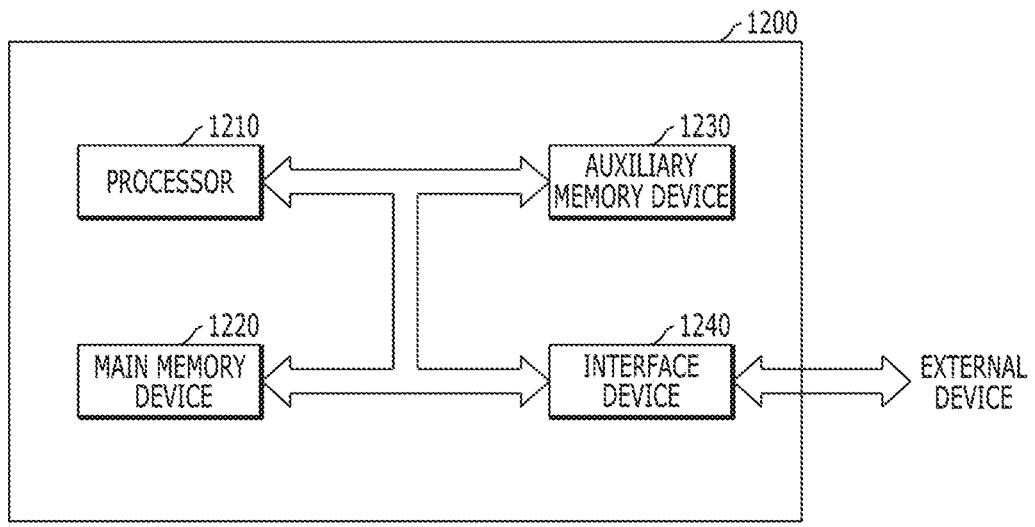
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element including a free layer having a variable magnetization direction; a pinned layer having a fixed magnetization direction; and a tunnel barrier layer interposed between the free layer and the pinned layer, wherein the free layer includes: a first free layer adjacent to the tunnel barrier layer and having a perpendicular magnetic anisotropy at an interface with the tunnel barrier layer; and a second free layer spaced apart from the tunnel barrier layer by the first free layer and having a saturation magnetization lower than a saturation magnetization of the first free layer. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element including a free layer having a variable magnetization direction; a pinned layer having a fixed magnetization direction; and a tunnel barrier layer interposed between the free layer and the pinned layer, wherein the free layer includes: a first free layer adjacent to the tunnel barrier layer and having a perpendicular magnetic anisotropy at an interface with the tunnel barrier layer; and a second free layer spaced apart from the tunnel barrier layer by the first free layer and having a saturation magnetization lower than a saturation magnetization of the first free layer. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
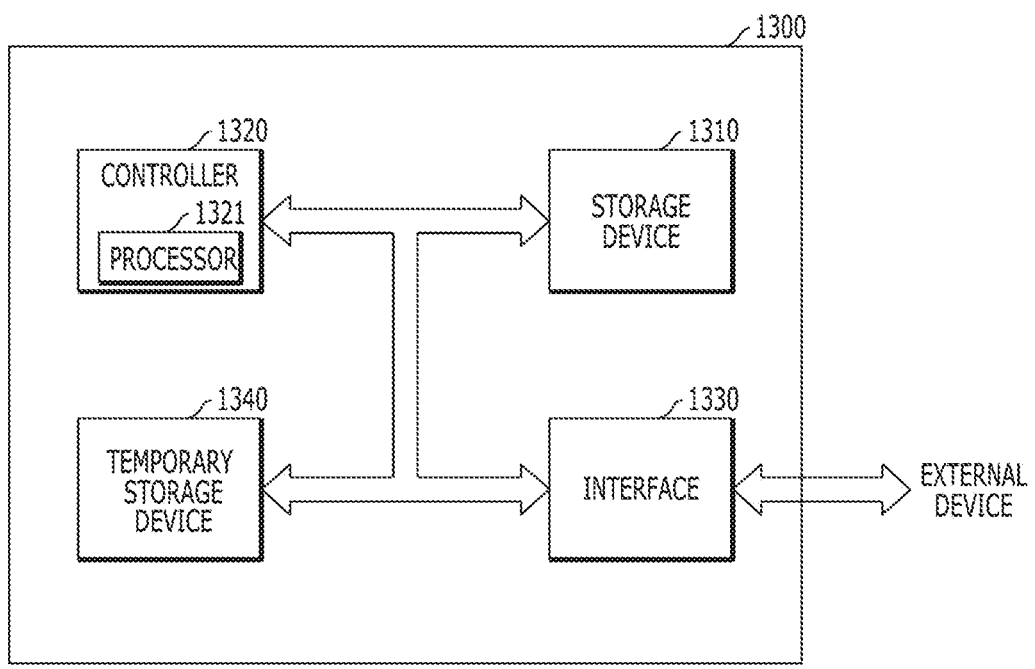
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element including a free layer having a variable magnetization direction; a pinned layer having a fixed magnetization direction; and a tunnel barrier layer interposed between the free layer and the pinned layer, wherein the free layer includes: a first free layer adjacent to the tunnel barrier layer and having a perpendicular magnetic anisotropy at an interface with the tunnel barrier layer; and a second free layer spaced apart from the tunnel barrier layer by the first free layer and having a saturation magnetization lower than a saturation magnetization of the first free layer. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 9:
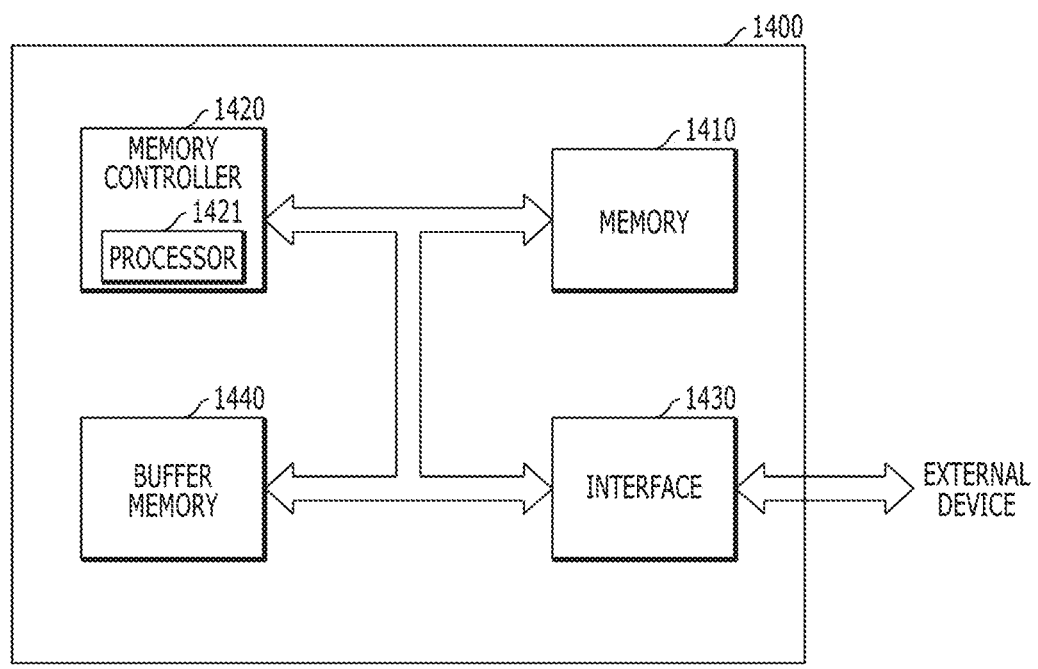
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element including a free layer having a variable magnetization direction; a pinned layer having a fixed magnetization direction; and a tunnel barrier layer interposed between the free layer and the pinned layer, wherein the free layer includes: a first free layer adjacent to the tunnel barrier layer and having a perpendicular magnetic anisotropy at an interface with the tunnel barrier layer; and a second free layer spaced apart from the tunnel barrier layer by the first free layer and having a saturation magnetization lower than a saturation magnetization of the first free layer. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element including a free layer having a variable magnetization direction; a pinned layer having a fixed magnetization direction; and a tunnel barrier layer interposed between the free layer and the pinned layer, wherein the free layer includes: a first free layer adjacent to the tunnel barrier layer and having a perpendicular magnetic anisotropy at an interface with the tunnel barrier layer; and a second free layer spaced apart from the tunnel barrier layer by the first free layer and having a saturation magnetization lower than a saturation magnetization of the first free layer. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory comprising a variable resistance element exhibiting different resistance states for storing data, the variable resistance element comprising:
   a free layer having a variable magnetization direction;
   a pinned layer having a fixed magnetization direction; and
   a tunnel barrier layer interposed between the free layer and the pinned layer,
   wherein the free layer includes:
   a first free layer adjacent to the tunnel barrier layer and including CoFeB alloy; and
   a second free layer spaced apart from the tunnel barrier layer by the first free layer and including at least one of CoFeBCd alloy or CoFeBSb alloy;
   the variable resistance element further comprises: a seed layer under the free layer; and a capping layer on the pinned layer, wherein the first free layer is closer to the capping layer than the second free layer, and the second free layer is closer to the seed layer than the first free layer.

2. The electronic device of claim 1, wherein the first free layer includes a first portion and a second portion, the first portion being closer to the tunnel barrier layer than the second portion, and
   a content of Fe in the first portion is greater than a content of Fe in the second portion.

3. The electronic device of claim 2, wherein the first ferromagnetic material includes CoFeB alloy, and
   a content of Co in the second portion is greater than a content of Co in the first portion.

4. The electronic device of claim 1, wherein a content of Fe in the first free layer increases towards the tunnel barrier layer.

5. The electronic device of claim 4, wherein the first ferromagnetic material includes CoFeB alloy, and
   a content of Co in the first free layer decreases towards the tunnel barrier layer.

6. The electronic device of claim 1, wherein a thickness of the second free layer is greater than a thickness of the first free layer.

7. The electronic device of claim 1, wherein the free layer further includes a spacer which is interposed between the first free layer and the second free layer and provides an exchange coupling therebetween.

8. The electronic device of claim 7, wherein the spacer includes a non-magnetic metal.

9. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

10. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory is part of the auxiliary memory device or the main memory device in the processing system.

11. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside,
    wherein the semiconductor memory is part of the storage device or the temporary storage device in the data storage system.

12. The electronic device of claim 1, wherein the seed layer and the capping layer comprise at least one of Ta, Ru, Pt, Mn, Al, Hf, Cr, W, Ti, TaN, AlN, HfN, CrN, WN, or TiN.

13. An electronic device comprising a semiconductor memory comprising a variable resistance element exhibiting different resistance states for storing data, the variable resistance element comprising:
    a seed layer including a conductive material;
    a free layer on the seed layer;
    a tunnel barrier layer on the free layer;
    a pinned layer on the tunnel barrier layer; and a capping layer on the pinned layer, the capping layer including the conductive material, wherein the free layer comprises:

a first free layer comprising CoFeB alloy and located closer to the tunnel barrier layer than the second free layer is, and a second free layer comprising at least one of CoFeBCd alloy or CoFeBSb alloy and located closer to the seed layer than the first free layer is, wherein a content of Fe in the first free layer is greater than a content of Fe in the second free layer.

14. The electronic device of claim 13, wherein the first free layer is in contact with the tunnel barrier layer and the second free layer is in contact with the seed layer.

15. The electronic device of claim 13, wherein the conductive material comprises at least one of Ta, Ru, Pt, Mn, Al, Hf, Cr, W, Ti, TaN, AlN, HfN, CrN, WN, or TiN.

* * * * *